United States Patent
Nagano

(10) Patent No.: US 7,692,163 B2
(45) Date of Patent: Apr. 6, 2010

(54) CHARGED PARTICLE BEAM APPARATUS, DEFECT CORRECTING METHOD, ETCHING METHOD, DEPOSITION METHOD, AND CHARGE PREVENTING METHOD

(75) Inventor: Osamu Nagano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 395 days.

(21) Appl. No.: 11/657,467

(22) Filed: Jan. 25, 2007

(65) Prior Publication Data

US 2007/0187622 A1    Aug. 16, 2007

(30) Foreign Application Priority Data

Jan. 31, 2006  (JP)  ............... 2006-023188

(51) Int. Cl.
*H01J 37/30* (2006.01)
(52) U.S. Cl. ............... 250/492.2; 250/441.11
(58) Field of Classification Search ............... 250/492.2, 250/441.11
See application file for complete search history.

(56) References Cited

U.S. PATENT DOCUMENTS

| | | | |
|---|---|---|---|
| 5,591,970 A | 1/1997 | Komano et al. | |
| 5,683,547 A | 11/1997 | Azuma et al. | |
| 6,875,987 B2 * | 4/2005 | Kondo | 250/442.11 |
| 6,991,878 B2 | 1/2006 | Kanamitsu et al. | |

FOREIGN PATENT DOCUMENTS

| | | |
|---|---|---|
| JP | 8-139079 | 5/1996 |
| JP | 2003-195481 | 7/2003 |
| JP | 2005-208120 | 8/2005 |

OTHER PUBLICATIONS

Notification of Reasons for Rejection issued by the Japanese Patent Office on July 3, 2009, for Japanese Patent Application No. 2007-012869, and English-language translation thereof.

* cited by examiner

*Primary Examiner*—Kiet T Nguyen
(74) *Attorney, Agent, or Firm*—Finnegan, Henderson, Farabow, Garrett & Dunner, L.L.P.

(57) ABSTRACT

A charged particle beam apparatus includes a column, the column having: a charged particle beam source which generates a charged particle beam to apply a charged particle beam to the surface of a substrate, a position where the charged particle beam is irradiated to the substrate being a beam position; and a gas mechanism provided in proximity to the substrate to supply a gas to the surface of the substrate, the gas mechanism having an opening which permits passage of the charged particle beam, a gas supply opening which locally injects the gas to the vicinity of the beam position, and a gas exhaust opening which exhausts the injected gas in the vicinity of the beam position to exhaust the gas.

8 Claims, 6 Drawing Sheets

CHARGED PARTICLE BEAM APPARATUS, DEFECT CORRECTING METHOD, ETCHING METHOD, DEPOSITION METHOD, AND CHARGE PREVENTING METHOD

CROSS REFERENCE TO RELATED APPLICATION

This application claims benefit of priority under 35 USC § 119 to Japanese patent application No. 2006-23188, filed on Jan. 31, 2006, the contents of which are incorporated by reference herein.

BACKGROUND OF THE INVENTION

1. Field of the Invention

The present invention relates to a charged particle beam apparatus, a defect correcting method, an etching method, a deposition method, and a charge preventing method, and is directed, for example, to irradiation of a beam to a substrate under a low vacuum used in a process of manufacturing an LSI and to correction of a defect in the substrate.

2. Related Background Art

A focused ion beam (FIB) apparatus with an ion source, mainly a gallium ion source, is used to correct defects in a substrate such as a photomask or a stencil mask. It has been recently known that if gallium ions are implanted into a part (glass part) of the photomask which transmits exposure light, so-called gallium stains are caused and decrease the transmission coefficient of the mask, and studies have started on gas assisted etching using an electron beam and various proposals have been made in order to eliminate the gallium stains (e.g., Japanese Laid Open (kokai) 2003-195481 and Japanese Laid Open (kokai) 8(1996)-139079).

However, for example, the disclosure in Japanese Laid Open (kokai) 8(1996)-139079) has the following problems.

(i) When a gas is supplied from a nozzle of a gas supply mechanism to the surface of a substrate, the gas injected from the nozzle diffuses in a vacuum and contaminates a chamber and the inside of an optical column, so that a wiring cable corrodes, and a charged particle beam source deteriorates, resulting in the instability of a charged particle beam.

(ii) It becomes impossible to limit the charged particle beam on the substrate due to the scattering of the beam resulting from the collision between the gas and the charged particle beam, so that the focal position of the charged particle beam is displaced.

(iii) If the gas supply mechanism (nozzle) is disposed in the vicinity of a beam position, nonuniform electric fields are produced in the beam position and its vicinity due to a charge-up caused in the vicinity of the beam position, resulting in an increase in the diameter of the beam and the shift of the beam position due to an aberration.

(iv) Since the gas pressure is high between the surface of the substrate and the gas supply mechanism, an electric discharge is caused between the surface of the substrate and the gas supply mechanism if a high retarding voltage is applied to the substrate or a stage.

SUMMARY OF THE INVENTION

According to a first aspect of the present invention, there is provided a charged particle beam apparatus comprising a column, the column including:

a charged particle beam source which generates a charged particle beam to apply a charged particle beam to the surface of a substrate, a position where the charged particle beam is irradiated to the substrate being a beam position; and a gas mechanism provided in proximity to the substrate to supply a gas to the surface of the substrate, the gas mechanism having an opening which permits passage of the charged particle beam, a gas supply opening which locally injects the gas to the vicinity of the beam position, and a gas exhaust opening which exhausts the injected gas in the vicinity of the beam position to exhaust the gas According to a second aspect of the present invention, there is provided a defect correcting method comprising:

generating a charged particle beam to apply the charged particle beam to the surface of a substrate with a defect;

locally injecting a gas to the vicinity of a position where the charged particle beam is irradiated to the substrate, a position where the charged particle beam is irradiated to the substrate being a beam position;

exhausting the injected gas in the vicinity of the beam position to exhaust the gas; and correcting the defect via at least one of removal of a part of the substrate and deposition of a film on the part of the substrate carried out by applying the charged particle beam and injecting the gas.

According to a third aspect of the present invention, there is provided an etching method comprising:

generating a charged particle beam to apply the charged particle beam to the surface of a substrate with a defect;

locally injecting a gas to the vicinity of a position where the charged particle beam is irradiated to the substrate, a position where the charged particle beam is irradiated to the substrate being a beam position;

exhausting the injected gas in the vicinity of the beam position to exhaust the gas; and selectively removing a part of the substrate by a change of the gas induced by the irradiation of the charged particle beam and the injection of the gas.

According to a fourth aspect of the present invention, there is provided a deposition method comprising:

generating a charged particle beam to apply the charged particle beam to the surface of a substrate having a defect;

locally injecting a gas to the vicinity of a position where the charged particle beam is irradiated to the substrate;

exhausting the injected gas in the vicinity of the beam position to exhaust the gas; and selectively depositing a film on a part of the substrate by a change of the gas induced by applying the charged particle beam and injecting the gas.

According to a fifth aspect of the present invention, there is provided a method of preventing a surface charge of a substrate in a treatment of the substrate using a charged particle beam apparatus, the charged particle beam apparatus scanning the surface of the substrate with a charged particle beam while injecting a gas to the surface of the substrate to selectively remove a surface layer of the substrate or to selectively deposit a film on the surface of the substrate, by the gas with the assistance of the electron beam, the method comprising:

locally injecting the gas to the vicinity of a position where the charged particle beam is irradiated to the substrate, a position where the charged particle beam is irradiated to the substrate being a beam position; and exhausting the injected gas in the vicinity of the beam position to exhaust the gas.

DETAILED DESCRIPTION OF THE INVENTION

An embodiment of the present invention will hereinafter be described in reference to the drawings.

Figure 1:
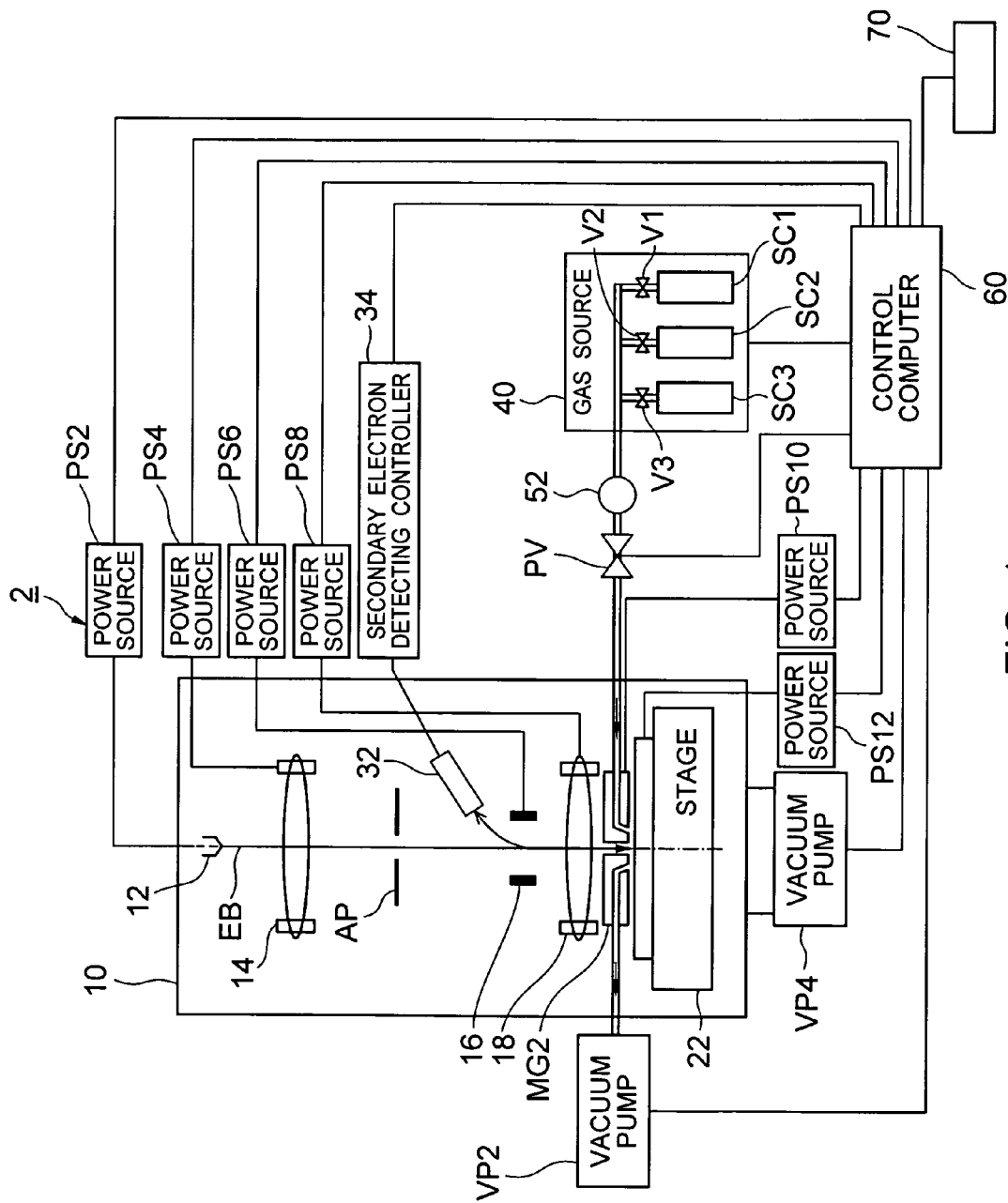
FIG. 1 is a block diagram showing a schematic configuration of an electron beam apparatus according to one embodiment of the present invention.

FIG. 1 is a block diagram showing a schematic configuration of an electron beam apparatus according to one embodiment of the present invention. An electron beam apparatus 2 shown in FIG. 1 comprises an optical column 10, vacuum pumps VP2 and VP4, various power sources PS2, PS4, PS6, PS8, PS10 and PS12, a secondary electron controller 34, a gas source 40, a gas flowmeter 52, a pressure control valve PV, a control computer 60, and a display 70. The optical column 10 includes an electron gun 12, a condenser lens 14, an aperture AP, a deflector 16, an objective lens 18, a stage 22, a secondary electron detector 32, and a gas mechanism MG2 which is characteristic in the present embodiment.

A sample is mounted on the upper surface of the stage 22. Hereinafter, a photomask is taken as an example of a sample M. The electron gun 12 is connected to the power source PS2 connected to control computer 60, and the electron gun 12 generates an electron beam EB in response to the application of a voltage following a command signal from the control computer 60, and irradiates the electron beam EB to the sample M. The electron beam EB is reduced in the process of passing through a plurality of lenses in the column 10, and irradiated to the sample M in a focused state. The condenser lens 14 is configured by an electrostatic or magnetic lens, and adjusts the diameter of the electron beam EB. At least one aperture AP is disposed in an optical path between the electron gun 12 and the sample M, and limits the passing electron beam EB to adjust the amount of a current irradiated to the sample. The objective lens 18 is configured by an electrostatic or magnetic lens, and adjusts a focal position so that the electron beam is focused on the surface of the sample. The deflector 16 deflects the electron beam EB so that the sample surface is scanned with the electron beam EB. The condenser lens 14, the deflector 16 and the objective lens 18 are respectively connected to the power sources PS4, PS6 and PS8, and these power sources control voltages or currents in accordance with the command signal sent from the control computer 60 and thus supply the voltages or currents to the lenses 14 and 18 and the deflector 16. In the present embodiment, the power source PS8 and the control computer 60 correspond to, for example, a focal position correcting unit.

The optical column 10 is connected to the vacuum pump VP4, and produces a medium vacuum or low vacuum on the side of the sample M from the aperture AP, and prevents gas molecules from entering the side of the electron gun 12 by differential pumping which produces a high vacuum on the side of the electron gun 12. The vacuum pump VP2 is connected to a gas exhaust nozzle SN of the gas mechanism MG2 which is characteristic in the present embodiment, and exhausts, by way of the gas exhaust nozzle SN, the gas locally injected to the vicinity of the position where the electron beam EB is irradiated to the sample M to exhaust the gas to the outside of the electron beam apparatus 2.

The sample M is connected to the power source PS12, and thus a retarding voltage is applied to the sample M. The gas mechanism MG2 is also connected to the power source PS10, and a voltage similar to the voltage applied to the sample M is applied to the gas mechanism MG2. This is one of the characteristic points of the present embodiment, and will be described later in detail.

The secondary electron detector 32 is connected to the secondary electron detecting controller 34, and the secondary electron detector 32 detects at least one of secondary electrons, reflection electrons and back scattering electrons (hereinafter referred to as "secondary electrons, etc.") released from the surface of the sample M in response to the irradiation of the electron beam EB, and supplies a detection signal to the secondary electron detecting controller 34. The secondary electron detecting controller 34 is connected to the control computer 60, and processes the detection signal supplied from the secondary electron detecting controller 34 to generate an image signal forming an SEM image, and then supplies the image signal to the control computer 60. The control computer 60 stores the received image signal to an unshown image memory, and also supplies the image signal to the display 70 to display the SEM image.

The gas source 40 includes a plurality of gas cylinders containing the same kind or different kinds of gases, and is connected to a gas supply nozzle BN of the gas mechanism MG2 in the optical column 10 by a gas supply pipe via the pressure control valve PV. In FIG. 1, three gas cylinders SC1 to SC3 are illustrated which are respectively connected to the gas supply pipe via valves V1 to V3. The gas flowmeter 52 is disposed between the gas source 40 and the pressure control valve PV. The gas flowmeter 52 is connected to the control computer 60, and measures the flow volume of the gas from the gas source 40 and transmits the result of the measurement to the control computer 60. The control computer 60 is also connected to the gas source 40 and the pressure control valve PV, and adjusts the valves V1 to V3 of the gas cylinders SC1 to SC3 and also controls the pressure control valve PV on the basis of data on the gas flow volume sent from the gas flowmeter 52.

Figure 2:
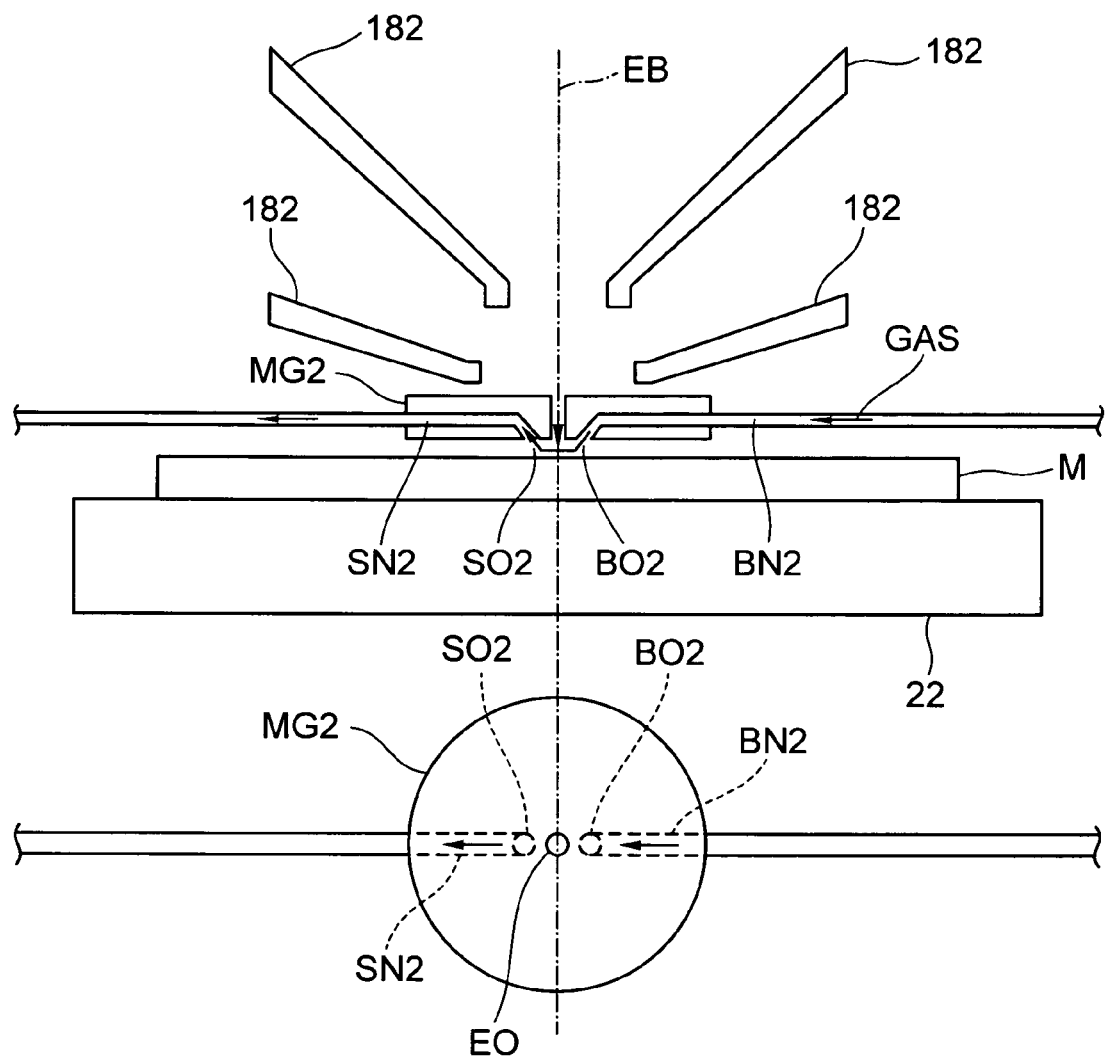
FIG. 2 is a sectional view and a plan view showing in more detail a gas mechanism MG2 provided in the electron beam apparatus in FIG. 1.

FIG. 2 is a sectional view and a plan view showing in more detail the gas mechanism MG2 provided in the electron beam apparatus 2 in FIG. 1. As shown in FIG. 2, the gas mechanism MG2 is formed of a conductive material such as a metal to have a disk shape. The gas mechanism MG2 is in proximity to the sample M between pole pieces 182 and the sample M, and disposed in parallel with the surface of the sample M. In the plan view, there is provided, in the center of the gas mechanism MG2, a round opening EO which permits the passage of the electron beam EB and which has, around the intersection of the optical axis of the electron beam and the surface of the sample M, such a diameter as not to prevent the trajectory of the secondary electrons, etc. generated in the surface of the sample M. The gas mechanism MG2 is also provided with a gas supply nozzle BN2 and a gas exhaust nozzle SN2 so that these nozzles penetrate the disk along its radial direction from opposite outer peripheral portions of the disk to the vicinity of the opening EO. In the example shown in FIG. 2, the gas supply nozzle BN2 and the gas exhaust nozzle SN2 are disposed horizontally with respect to the bottom surface of the gas mechanism MG2 in the peripheral area and the central area of the disk except for the area in the vicinity of the opening EO. Moreover, the gas supply nozzle BN2 and the gas exhaust nozzle SN2 are disposed to tilt toward the bottom surface of the gas mechanism MG2 from the area in the vicinity of the opening EO, and further reach the bottom surface of the gas mechanism MG2 to serve as a gas supply opening BO2 and a gas exhaust opening SO. However, the direction of the gas supply opening BO2 is adjusted so that the intersection of the normal of the gas supply opening BO2 and the sample M is off the optical axis of the electron beam EB, more specifically, so that the place where the flow of the gas injected from the gas supply opening BO2 directly bumps into the sample M is located off the optical axis of the electron beam EB. The outer peripheral side of the gas supply nozzle BN2 is connected to the gas cylinders of the gas source 40 via the gas supply pipe. The outer peripheral side of the gas exhaust nozzle SN2 is connected to the vacuum pump VP2 via the gas supply pipe.

The exhaust conductance of a gap portion between the sample M and the gas mechanism MG2 and the exhaust conductance of the opening EO are desirably configured to be sufficiently lower than the exhaust conductance of a gas exhaust opening SO2, and they are preferably sufficiently differentially pumped. The distance between the gas mechanism MG2 and the sample M is desirably 1 mm or less, for example.

A first characteristic of the present embodiment is that the gas is locally supplied and exhausted so as to limit the gas path to a required region of the sample M without filling the whole sample chamber with the gas. The movable area of the stage is restricted. On the other hand, the size of a substrate used in manufacturing, e.g. a semiconductor device and a liquid crystal device is increasing. Therefore, in some cases a very large sample chamber is required up to a few times as large as a substrate. According to the present embodiment, even in such cases, it is possible to locally supply and exhaust the gas so that the gas path is confined to the required region of the sample M. Consequently, the gas volume can be decreased as well as contamination in the chamber can be prevented.

A second characteristic of the present embodiment is that the gas mechanism MG2 is disposed in proximity to the sample M, and that the gas mechanism MG2 is provided not only with the gas supply opening BO2 for gas injection but also with the gas exhaust opening SO2 for exhausting the injected gas in the vicinity of a gas supply opening BO to exhaust the gas. The gas is injected in the vicinity of the surface of the sample M, such that the gas pressure in the surface of the sample can be increased to increase an etching rate and a deposition rate, and the injected gas is exhausted from the vicinity of the gas supply opening BO by the gas exhaust opening, such that it is possible to prevent the gas from diffusing into a vacuum. Thus, it is possible to reduce the deterioration in the degree of the vacuum and contamination due to the adsorption of gas molecules by the inner wall of the optical column 10, and prevent the deterioration of a wiring line system due to a reactive gas. In addition, the correction and simplification of a gas treatment system can be achieved, such as an improvement of stability owing to the prevention of the deterioration of an electron gun chip and owing to a heightened vacuum in an electron gun chamber. Not only the direction of the gas supply opening BO2 but also the direction of the gas exhaust opening SO2 is desirably adjusted so that the intersection of the normal of the exhaust opening SO2 and the sample M is off the optical axis of the electron beam EB.

A third characteristic of the present embodiment is that the gas supply nozzle BN2 and the gas exhaust nozzle SN2 are disposed to penetrate the inside of the gas mechanism MG2 from the outer side surface of the gas mechanism MG2 to the round opening EO, and that both the gas supply opening BO2 and the exhaust opening SO2 are not disposed at positions facing the electron beam EB (positions visible from the optical axis) but are provided to exit the bottom surface of the gas mechanism MG2 so that these openings BO2 and SO2 are substantially parallel with the side of the sample M. This makes it possible to improve problems such as an aberration and the drift of the beam caused when the shapes and positions of the openings are asymmetrical with respect to the optical axis due to a mechanical tolerance. Here, the gas supply opening BO2 is sized to have, for example, a diameter of about several hundred μm to several mm, and the gas exhaust opening SO2 is sized to have, for example, a diameter of several mm or more.

Figure 3:
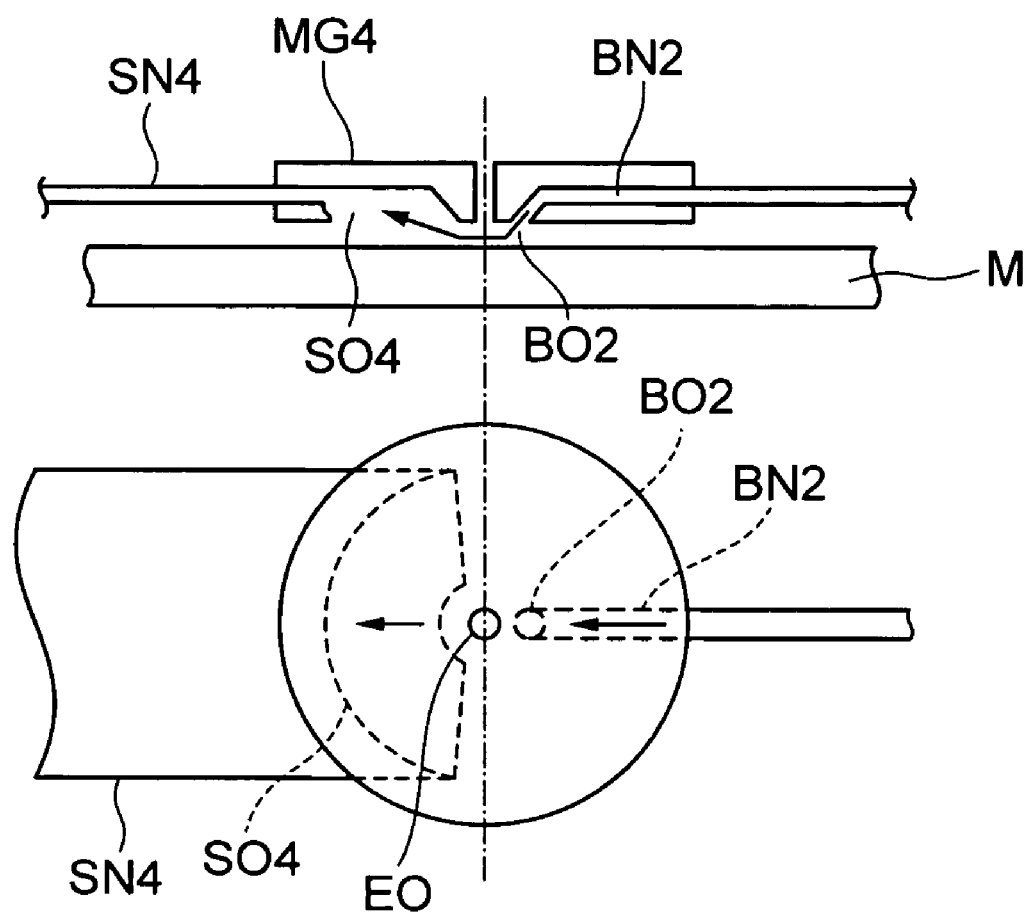
FIG. 3 is a sectional view and a plan view showing another example of the gas mechanism.

Another example of the gas mechanism is shown in FIG. 3. A gas mechanism MG4 shown in FIG. 3 is different from the gas mechanism MG2 shown in FIG. 2 in the shape of a gas exhaust opening SO4. The gas exhaust opening SO4 is formed to have a fan-like planar shape having an area occupying nearly half circle of the disk, such that the exhaust conductance can be increased.

Figure 4:
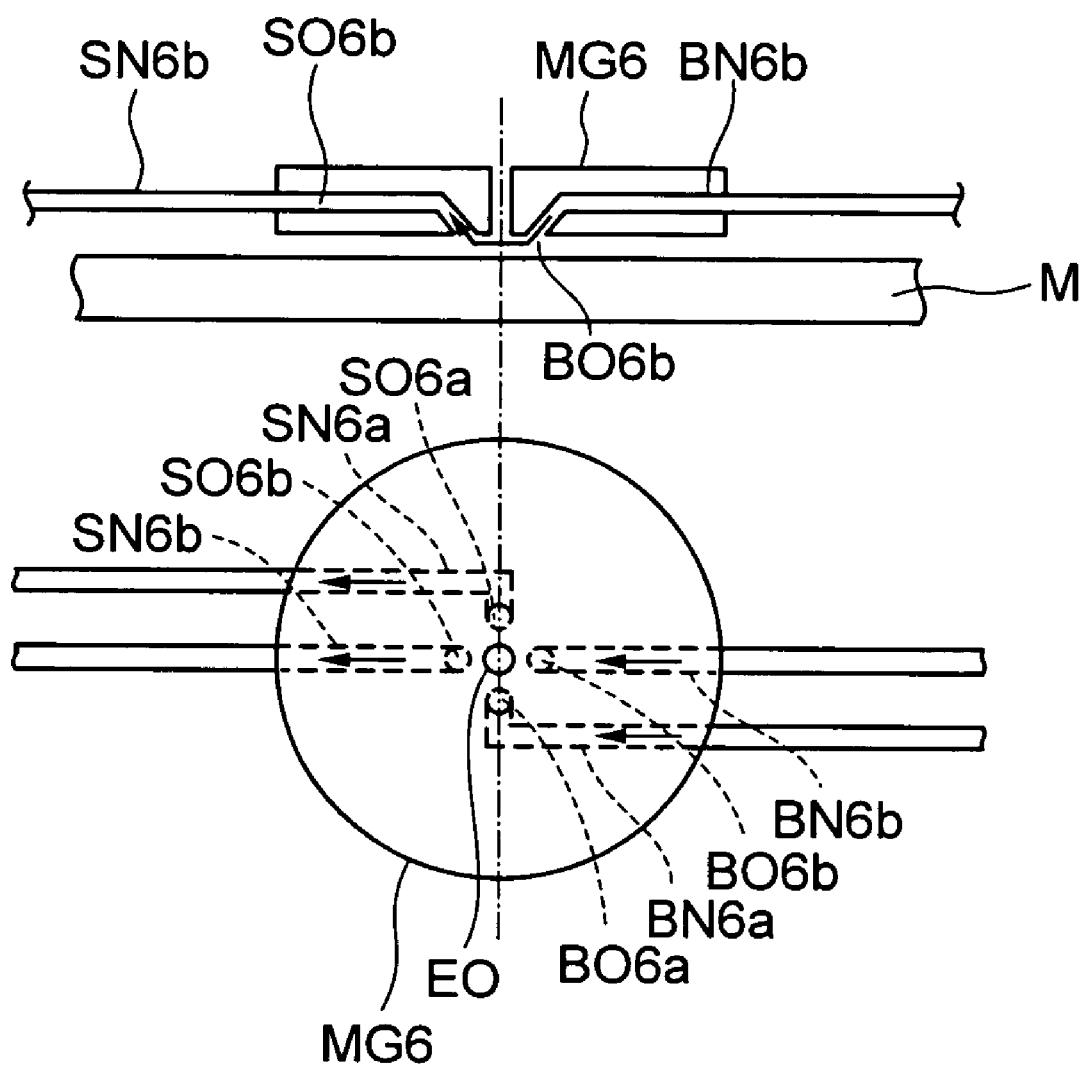
FIG. 4 is a sectional view and a plan view showing still other example of the gas mechanism.
Figure 5A:
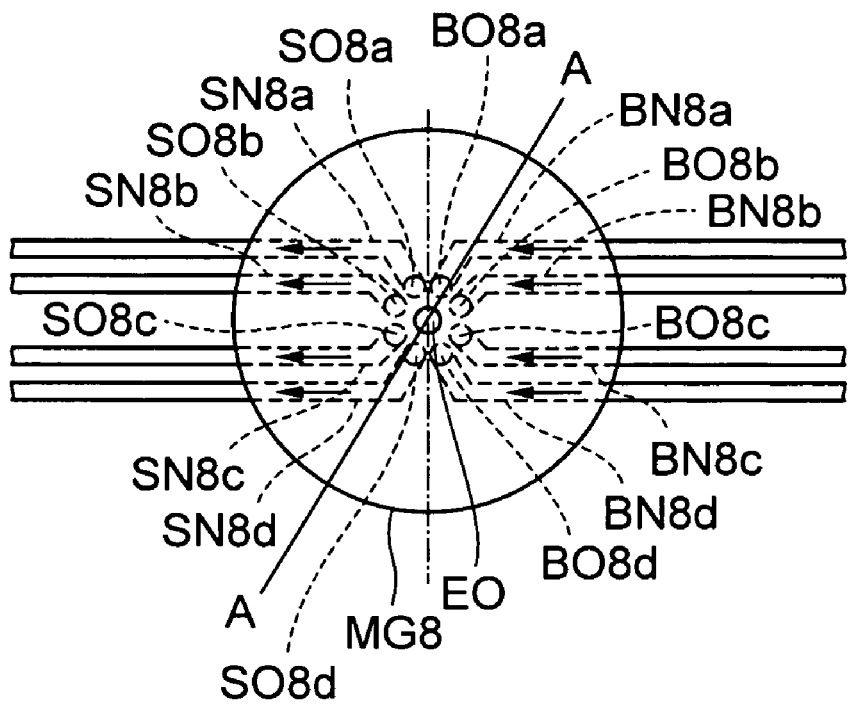
FIG. 5A is a plan view showing further still other example of the gas mechanism.
Figure 5B:
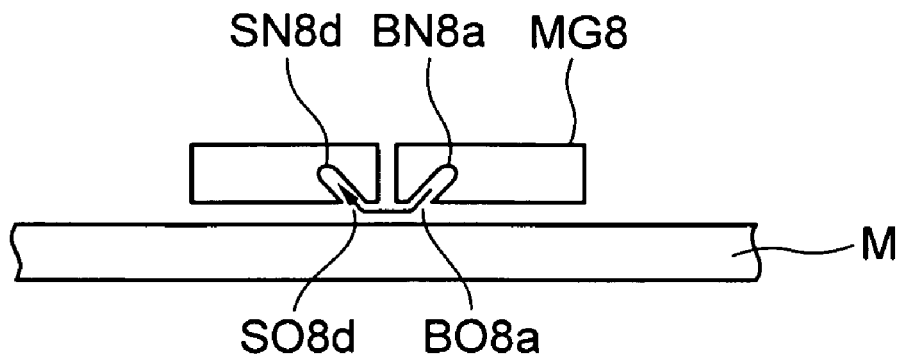
FIG. 5B is a sectional view along line A-A of FIG. 5A.

FIG. 4 is a sectional view and a plan view showing still other example of the gas mechanism and FIG. 5A is a plan view showing further still other example of the gas mechanism and FIG. 5B is a sectional view along line A-A of FIG. 5A. The examples shown in FIGS. 4 to 5B are characterized in that the number of at least one of the gas supply openings and the gas exhaust openings provided to the gas mechanism is more than one. More specifically, a gas mechanism MG6 shown in FIG. 4 is provided with two gas supply openings BO6a, BO6b and two gas exhaust openings SO6a, SO6b, and a gas mechanism MG8 shown in FIGS. 5A and 5B is provided with four gas supply openings BO8a to BO8d and four gas exhaust openings SO8a to SO8d. Such arrangements improve the uniformity of the gas in the area where the electron beam EB is irradiated. Furthermore, as are shown in the examples of FIGS. 4 to 5B, the gas supply openings and the gas exhaust openings are arranged in a symmetric manner with respect to the optical axis, and the total number of the gas supply openings and the gas exhaust openings are set to four times N (4×N; N is a natural number), thereby enabling to decrease aberration which would otherwise occur due to asymmetry with respect to the optical axis.

Next, a method of correcting a defect of the sample M using the electron beam apparatus 2 shown in FIG. 1 will be described below.

First, a gas having an etching effect or a deposition effect is prepared in accordance with the material of a pattern, and the gas cylinders SC1 to SC3 in the gas source 40 are charged with this gas. Then, the electron beam EB is generated by the electron gun 12 so that the surface of the sample M is scanned by the deflector 16, and the secondary electrons, etc. generated in the surface of the sample M are detected by the secondary electron detector 32 to acquire an SEM image which is displayed on the display 70.

When a defect is found from the SEM image, the gas cylinder SC containing a desired kind of gas is selected from the gas source 40, and the gas is injected from the gas supply opening BO2 to the position where the electron beam is irradiated to the sample M while the flow volume of the gas is adjusted by the pressure control valve PV. The defective area in the surface of the sample M is scanned with the electron beam EB simultaneously with the injection of the gas, such that the material of the surface of the sample M is selectively removed by etching using the electron beam with the assistance of the gas, or a film is deposited on the surface of the sample M. Since the photomask is used as the sample M in the present embodiment, halogen gas such as fluorine ($F_2$), chlorine ($Cl_2$), iodine ($I_2$) and bromine ($Br_2$) or a mixed gas of these substances, or a gas in which oxygen ($O_2$), nitrogen ($N_2$) and hydrogen ($H_2$) are further added to the above-mentioned gases can be used for the etching of chromium (Cr) and molybdenum silicide (MoSi) formed on a quartz substrate. Further, a compound gas containing, for example, carbon (C), tungsten (W) or platinum (Pt), or a mixed gas of these substances is used for the deposition of the film.

Figure 6:
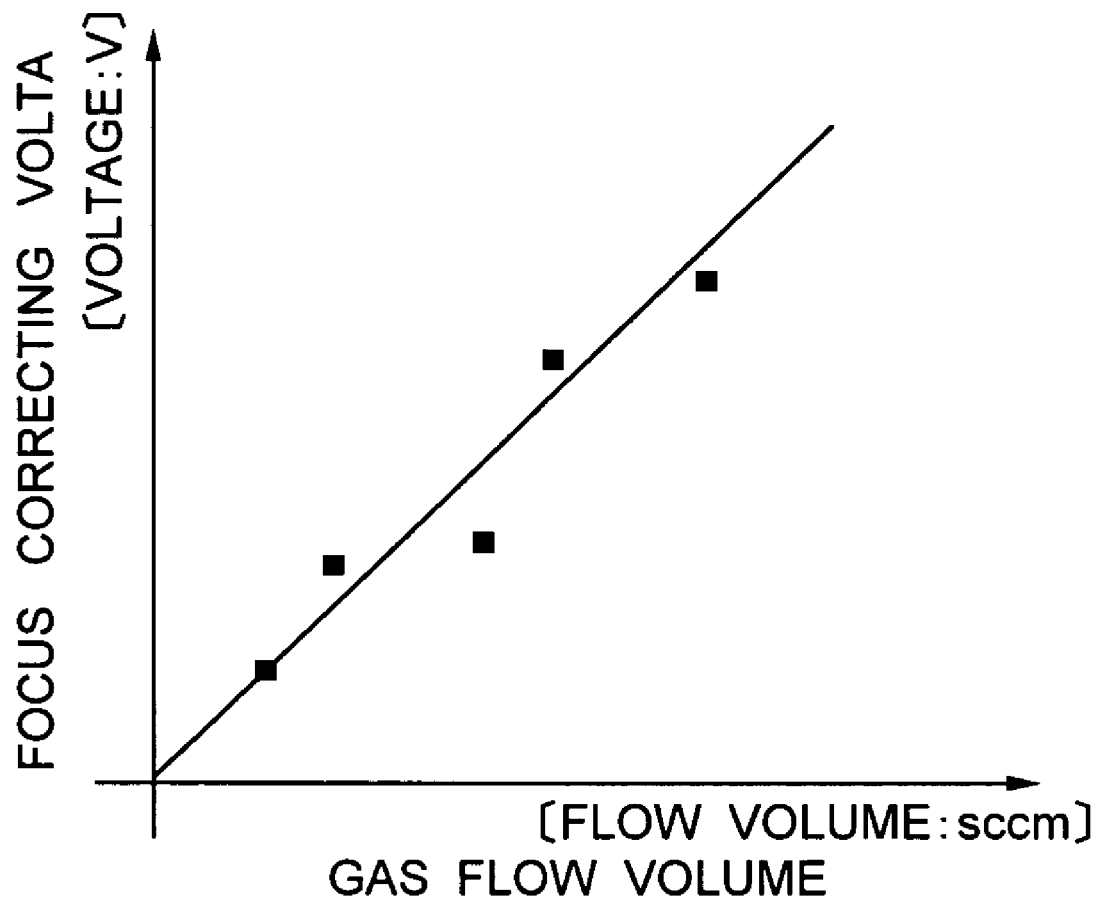
FIG. 6 is a diagram showing one example of the relation between the flow volume of a gas injected to the surface of a substrate and a focus voltage of an objective lens.

When the flow volume of the gas increases, it becomes difficult to limit the electron beam EB on the surface of the sample M due to the scattering caused by a collision between the electron beam EB and the gas. One example of the relation between the gas flow volume and a focus voltage of the objective lens 18 at this point is shown in FIG. 6. Using the relation between the gas flow volume and the focus voltage as shown in FIG. 6, the focal position of the electron beam EB is adjusted by the objective lens 18 in accordance with the gas flow volume while the flow volume of the gas supplied to the surface of the sample M is being monitored by the gas flowmeter 52, such that the defect can be corrected with high accuracy.

A fourth characteristic of the present embodiment is that a voltage is also applied to the gas mechanism MG in accordance with the application of the retarding voltage to the sample M (stage 22) to reduce an electric field in an area with a high gas pressure between the surface of the sample M and the gas mechanism MG. This solves the problem of a possible electric discharge between the surface of the sample M and the gas mechanism MG. Thus, even when an accelerating voltage is increased to several kV or more, for example, 3 to 50 kV, the landing energy (e.g., 500 eV to 1000 eV) of the beam is reduced not only by the application of a negative retarding voltage to the sample M (stage 22) but also by the application of a similar voltage to the gas mechanism MG, thereby enabling a high-throughput correction with high etching rate and deposition rate. Moreover, if a method is applied to the present embodiment which causes a gas to flow to the vicinity of the electron beam EB irradiation area of the sample M to produce a low-vacuum area in order to prevent the surface charge of the sample M (the gas is, for example, $N_2$, Ar or $H_2O$), the blur of the beam and the displacement of the beam position due to the charge are eliminated, so that it is possible to achieve an electron beam apparatus with a higher resolution and higher accuracy.

While one embodiment of the present invention has been described above, the present invention is not limited to the embodiment described above, and various modifications can be made within the technical scope thereof. For example, the apparatus using the electron beam as a charged particle beam has been taken as an example in the embodiment described above, but it should be understood that the present invention can also be applied to, for example, an FIB apparatus using an ion beam as the charged particle beam. The photomask has been taken as an example of the sample, but it should be understood that the present invention can also be applied to, for example, a stencil mask or a semiconductor substrate. Moreover, the gas mechanism having the disk shape has been described, but this is not a limitation, and the gas mechanism may have a polygonal planar shape such as a rectangular planar shape.

What is claimed is:

1. A charged particle beam apparatus comprising a column, the column including:
    a charged particle beam source which generates a charged particle beam to apply a charged particle beam to the surface of a substrate, a position where the charged particle beam is irradiated to the substrate being a beam position; and
    a gas mechanism provided in proximity to the substrate to supply a gas to the surface of the substrate, the gas mechanism having an opening which permits passage of the charged particle beam, a gas supply opening which locally injects the gas to the vicinity of the beam position, and a gas exhaust opening which exhausts the injected gas in the vicinity of the beam position to exhaust the gas.

2. The charged particle beam apparatus according to claim 1,
    wherein at least one of the gas supply opening and the gas exhaust opening is disposed so that an intersection of a normal thereof and the substrate is off an optical axis of the charged particle beam.

3. The charged particle beam apparatus according to claim 1, further comprising:
    an objective lens which is provided between the gas mechanism and the charged particle beam source in the column and which focuses the charged particle beam; and
    a focal position correcting unit which corrects a focal position of the objective lens in accordance with a flow volume of the injected gas.

4. The charged particle beam apparatus according to claim 1, further comprising a stage which supports the substrate and to which a voltage can be applied,
    wherein the gas mechanism functions as an electrode to which a voltage can be applied.

5. The charged particle beam apparatus according to claim 1,
    wherein the gas supply opening and the gas exhaust opening are provided so as to penetrate the inside of the gas mechanism substantially in parallel with the substrate from an outer side surface to the opening of the gas mechanism, and exit a bottom surface of the gas mechanism opposite to the substrate on the periphery of the opening.

6. The charged particle beam apparatus according to claim 1,
    wherein the gas exhaust opening has a fan-like planar shape.

7. The charged particle beam apparatus according to claim 1,
    wherein the number of at least one of the gas supply openings and the gas exhaust openings is more than one.

8. The charged particle beam apparatus according to claim 1,
    wherein the total number of the gas supply openings and the gas exhaust openings is four times N (4×N; (N is a natural number)).

* * * * *